United States Patent [19]
Drouot et al.

[11] Patent Number: 5,612,611
[45] Date of Patent: Mar. 18, 1997

[54] SWITCHING REGULATOR WITH DYSSYMETRICAL DIFFERENTIAL INPUT STAGE

[75] Inventors: Sylvie Drouot, Luynes; Gérard D. F. Silvestre, Fuveau, both of France

[73] Assignee: SGS-Thomson Microelectronics S.A., Saint Genis Pouilly, France

[21] Appl. No.: 423,398

[22] Filed: Apr. 19, 1995

[30] Foreign Application Priority Data

Apr. 21, 1994 [FR] France .................................. 94 04983

[51] Int. Cl.$^6$ .................................................. G05F 1/613
[52] U.S. Cl. ............................................ 323/223; 323/299
[58] Field of Search ..................................... 323/223, 225, 323/268, 271, 282, 283, 299

[56] References Cited

U.S. PATENT DOCUMENTS 4,609,863  9/1986  Asai et al. ............................... 323/223
5,550,411  8/1996  Baker ....................................... 323/223

FOREIGN PATENT DOCUMENTS 0342581  11/1989  European Pat. Off. .......... G05F 3/24
0539593  5/1993  European Pat. Off. .......... G05F 1/56

*Primary Examiner*—Jeffrey L. Sterrett
*Attorney, Agent, or Firm*—David M. Driscoll; James H. Morris; John N. Anastasi

[57] ABSTRACT

A voltage regulator circuit having one input to receive a voltage to be limited, this input being connected to a ground by means of a limiting transistor. To control this transistor, a comparator and a dissymetrical differential stage are used. The differential stage receives the voltage to be limited and a reference voltage produced by means of a Zener diode, and supplies the comparator with voltages lower than those that it receives. The output of the comparator is connected to the control gate of the limiting transistor. This regulator circuit can advantageously be used to regulate a voltage produced by a voltage multiplier within an electrically programmable memory.

22 Claims, 3 Drawing Sheets

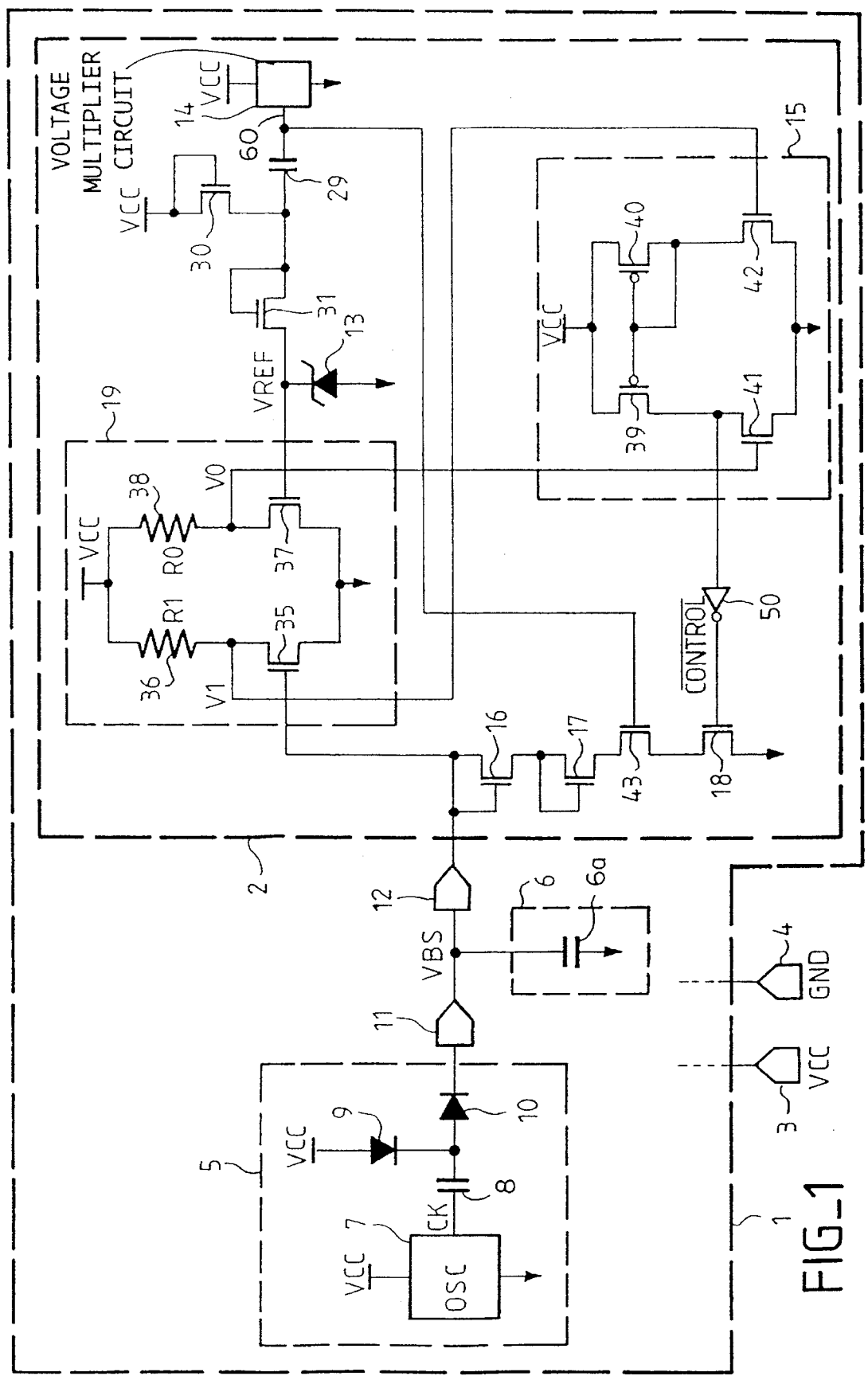
FIG_1

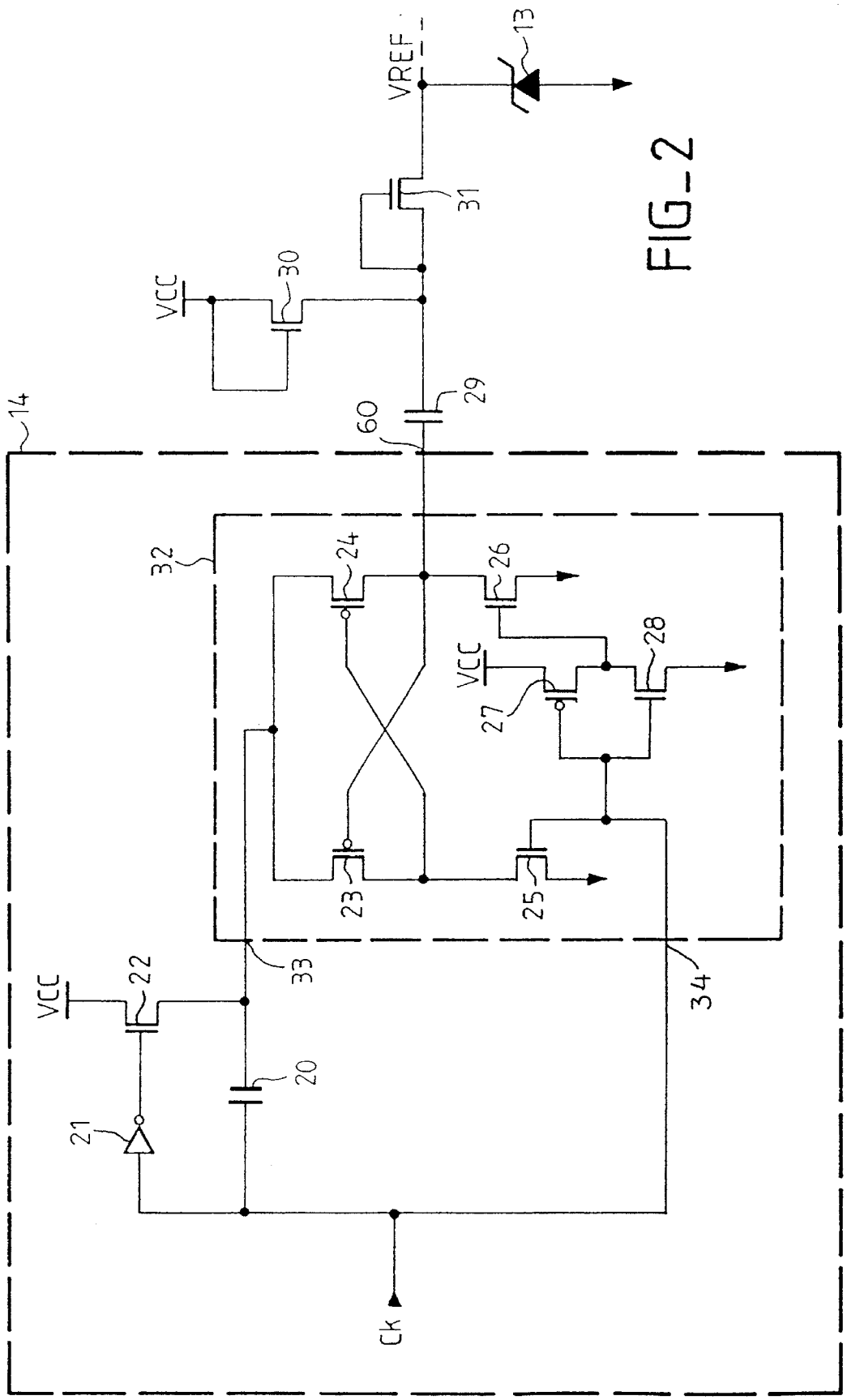
FIG_2

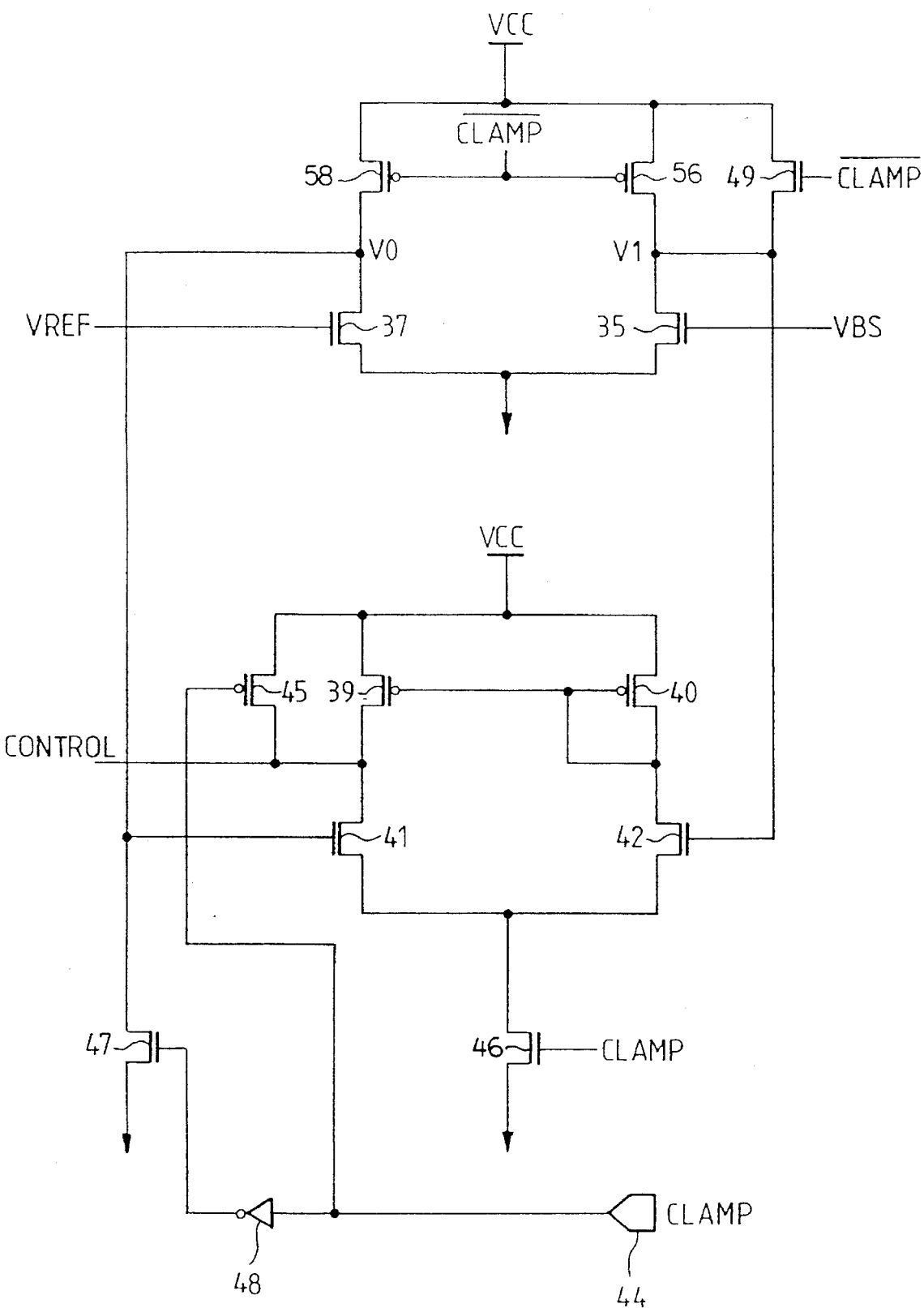
FIG_3

SWITCHING REGULATOR WITH DYSSYMETRICAL DIFFERENTIAL INPUT STAGE

BACKGROUND OF THE INVENTION

1. Field of the Invention

The invention relates to a voltage regulator circuit using a Zener diode to produce a stable reference voltage, comparison means to compare a supply voltage with this reference voltage and regulation means to limit the supply voltage accordingly. It can be applied for example to the limiting of the value of the output voltage of a voltage-multiplier circuit, for example within a programmable electrical memory.

2. Discussion of the Related Art

In many electronic applications, it becomes necessary to use circuits to produce analog supply voltages suited to the proper working of the application. It may thus be necessary, starting from a basic supply which may be a battery or a mains supply, to develop circuits used to reduce or increase the basic supply voltage available. For example, if a microprocessor of a computer connected to the mains is supplied directly with 220 volts it will be destroyed. On the contrary, if it is desired to make a high-impedance measuring instrument supplied by a battery, it will be necessary to develop a switching regulator in order to have sufficient measuring currents available. A given circuit could also be formed by different modules requiring the production of supply voltages proper to these modules. For example, if it is desired to supply a microcontroller formed by at least one microprocessor and one read-only memory, it might be necessary to produce supply voltages of different values for the microprocessor and the memory.

Indeed, if we consider a MOS type memory organized in matrix form with cells formed by MOS transistors, it could be necessary to provide supply circuits internal to this memory to produce specific voltages in order to bias the control gates of these transistors. Typically, supply voltages greater than the rated voltage of the circuit (of the order of 3 to 5 volts) will be produced by means of voltage multipliers.

Conventionally, a voltage multiplier circuit (also called a load pump) is used to produce an output voltage from a received supply voltage by charging and discharging one or more capacitors consecutively, in such a way that the output voltage is greater than the received supply voltage. The output voltage increases gradually to reach an asymptotic value that is typically equal to a multiple of the received supply voltage. For example, to produce an output voltage equal to twice the received voltage, it is possible to use a circuit called a "Schenkel doubler". One drawback of this type of circuit is the fact that the output voltage increases ever less rapidly with time. In order to reduce the time needed to reach the desired output voltage, therefore, it becomes necessary to oversize the multiplier and to limit it at output. For example, instead of using a circuit that doubles the received voltage, the circuit used is one that triples it and the output voltage is limited to twice the voltage received once this value is reached.

Thus, to limit the value of the output voltage, it is possible typically to use a parallel regulator. The regulators contain three basic elements: a precision reference voltage, an error amplifier and a power control element. The different subunits of a regulator are connected in a negative feedback loop in such a way that the output voltage is controlled and remains constant.

The simplest regulator consists of a Zener diode parallel-connected to a load supplied by the output voltage. The term "load" is understood to mean, for example, the capacitance equivalent to a set of control gates of MOS transistors of a memory. One drawback of this type of regulator is that the output voltage is set so as to be equal to the reverse voltage of a Zener diode or to a multiple of this reverse voltage (in the case of several series-connected diodes). Thus, the voltage cannot be limited to a value lower than that of the reverse voltage of the Zener diode. Indeed, the diode has to be supplied with a voltage greater than this reverse voltage to obtain this reference value. Now, it is increasingly sought to develop products that work with a low supply voltage, of the order of 3 volts. If it is desired, for example, to produce a voltage of 4.5 volts, it would not be possible to use a diode whose reverse voltage value is 5.5 volts in the current state of the art.

Conventionally, when the desired output voltage is greater than the reverse voltage of a reference Zener diode, there also exist known regulators where a transistor controlled by the output of a comparator is parallel-connected to the load. At an input of this comparator, the reverse voltage of a reference Zener diode is compared with a fraction of the output voltage picked up by means of a voltage divider bridge.

An arrangement might be designed where this system is adapted by dividing the reference voltage in this way. This approach is not acceptable. For, it requires a resistive chain in parallel with a load, and when the load is capacitive, this increases the build-up time of the output voltage.

Further, it is not possible to make direct comparisons of the reverse voltage and the voltage to be limited if the voltage is to be limited to a value below the value of the reverse voltage and, secondly, even if the opposite is the case, since a comparator cannot be used for this purpose if the supply voltage available for the comparator is lower than the voltages to be compared.

In view of the foregoing, the aim of the present invention is to propose a voltage regulation circuit that can be used to limit a voltage to a value below a reference voltage, these two voltages being greater than a supply voltage.

SUMMARY OF THE INVENTION

According to the invention, this aim is achieved by a voltage regulator circuit to limit an internal supply voltage produced by a supply circuit, this regulator circuit comprises a Zener diode to produce a reference voltage, and further comprises a two-input comparator to control limiting means in order to regulate the internal supply voltage, and a dissymetrical differential stage having two inputs and two outputs. The first input is connected to the control gate of a first transistor series-connected with a first resistor between a supply input terminal receiving a supply voltage and a reference terminal receiving a reference voltage. The second input is connected to the control gate of a second transistor, series-connected with a second resistor between the supply input terminal and the reference terminal. The first output is formed by the midpoint of the first transistor and resistor. The second output is formed by the midpoint of the second transistor and resistor and the first and second outputs are connected to the inputs of the comparator.

In one embodiment, the circuit has a voltage multiplier circuit to supply the Zener diode at one output the limiting means have a resistor series-connected with a limiting transistor, the limiting transistor has its control gate connected to the output of the comparator, the limiting means have a second limiting transistor whose control gate is connected to the output of the voltage multiplier circuit, and the circuit has control means to inhibit the voltage regulation circuit when a binary control limitation signal is in a first state.

Thus, the problem of the supply of the Zener diode is resolved because it is no longer supplied by the circuit producing the internal voltage. Furthermore, since the internal voltage and the reference voltage are applied to control gates of transistors, there is no longer any tapping of current from a capacitive load if any to produce lower comparison voltages.

To fix the maximum value of the internal voltage, it is enough to determine the values of the resistors of the differential stage accordingly. It would thus be possible to fix a maximum value that is below the value of the reference voltage.

BRIEF DESCRIPTION OF THE DRAWINGS

The invention will be understood more clearly and other particular features and advantages shall appear from the following detailed description of a preferred exemplary embodiment. This description is given purely by way of an indication and in no way restricts the scope of the invention, and is illustrated by the following figures:

FIG. 1 shows a circuit made according to the invention,

FIG. 2 shows a voltage multiplier circuit used to produce the discharge signal,

FIG. 3 shows a variant of the circuit made according to the invention, comprising selection means to deactivate the limiting circuit.

DETAILED DESCRIPTION

FIG. 1 illustrates an integrated circuit 1 comprising a voltage regulator circuit 2.

It will be noted that the description is made with reference to an integrated circuit comprising a voltage-multiplier circuit and a voltage-regulator circuit. The invention can be used advantageously in an electrically programmable type of memory. It is possible nevertheless, without departing from the framework of the invention, to conceive of an arrangement where the voltage regulator circuit is set in an independent integrated circuit, or even an arrangement where this circuit is made by means of discrete components.

This circuit 1 comprises:

a supply input terminal 3 to receive a supply voltage VCC, a reference input terminal 4 to receive a reference voltage GND.

In practice, the input terminal 4 is a ground. In one example, VCC will be equal to 3 volts.

The circuit 1 furthermore comprises a first voltage multiplier 5 and a capacitive circuit 6 supplied by the voltage multiplier circuit 5.

The voltage multiplier circuit 5 has an oscillator 7 supplied by the supply voltage VCC and the ground delivering a clock signal CK. The clock signal CK is applied to the first terminal of a capacitor 8, the second terminal of which is connected to the supply terminal 3 by means of a diode 9 and to an output terminal 11 by means of an insulator diode 10.

The capacitive circuit 6 is modelized by a capacitor 6a connected between the output terminal 11 and the ground 4.

This arrangement thus entails assuming the use of a Schenkel multiplier circuit that doubles the supply voltage VCC.

The voltage present at the output terminal 11 is called the internal voltage VBS. It is this voltage VBS that is to be limited. In one example, VBS will be limited to 4.5 volts, namely to a maximum value ranging from the value of the supply voltage VCC to the maximum value that can be achieved by the Schenkel doubler.

The capacitor 6a modelizes, for example, a set of control gates of field-effect transistors in the storage cells of an electrically programmable read-only memory.

The regulator circuit 2 comprises:

an input 12 to receive the internal voltage VBS, reference means 13, 14 and 29 to 31 to produce a reference voltage VREF, a two-input comparator 15 to control limiting means 16 to 18 to limit the value of the internal voltage VBS to a maximum value VBSM, a differential stage 19 receiving the internal voltage VBS and the reference voltage VREF.

The reference means comprise a Zener diode 13 whose anode is connected to the ground 4 and whose cathode is connected to the output 60 of a second voltage multiplier circuit 14 by means of a diode 31 and a capacitor 29.

In one example, it is assumed that the reverse voltage of the Zener diode is 5.5 volts, namely greater than both the maximum internal voltage VBS and the supply voltage VCC. The voltage multiplier circuit 14, illustrated in FIG. 2, has a capacitor 20 which receives a clock signal CK at one of its terminals. In one example, this clock signal is identical to the clock signal delivered by the oscillator of the first voltage multiplier circuit 5. The circuit 14 could also have an oscillator to deliver a different clock signal. The second terminal of the capacitor 20 is connected to the supply terminal 3 by means of an N type transistor 22. The control gate of this transistor 22 receives the clock signal CK by means of an inverter 21. Thus, this second terminal will be alternately carried to the potential VCC when the clock signal CK is in the low state (ground potential) and to 2*VCC when this signal CK is in the high state (potential of VCC). The voltage multiplier 14 also has a change-over switch 32.

At one input 34, this switch 32 receives the clock signal CK. This clock signal CK is applied to the input of an inverter formed by two transistors 27 and 28, which are respectively a PMOS type and an NMOS type transistor, that are series-connected between the supply terminal 3 and the ground 4.

This inverter therefore delivers the clock signal CK at its output. The change-over switch 32 furthermore has two arms each formed by two transistors, respectively a PMOS type and an NMOS type transistor, that are series-connected between an input 33 and the ground 4. The input 33 is connected to the second terminal of the capacitor 20.

The NMOS type transistor 25 of the first arm has its control gate connected to the input of the inverter. The NMOS type transistor 26 of the second arm has its control gate connected to the output of this same inverter. The PMOS type transistor 23 of the first arm has its control gate connected to the midpoint of the transistors 24 and 26 of the second arm. The PMOS type transistor 24 of the second arm has its control gate connected to the midpoint of the transistors 23 and 25 of the first arm.

Finally, the switch has an output, corresponding to the output 60 of the voltage multiplier circuit 14. This output is connected to the midpoint of the transistors 24 and 26 of the second arm of the switch.

The output 60 of the voltage multiplier circuit 14 is therefore either at the ground potential or at 2*VCC depending on whether the clock signal CK is low or high.

There is thus a way of supplying the Zener diode 13 from the supply voltage VCC. To compensate for losses if any, due for example to parasitic capacitances, it is possible to envisage the addition of a multiplication stage by connecting the output 60 of the circuit 14 to a first terminal of a capacitor 29. The second terminal of this capacitor 29 will be connected to the supply terminal 3 by means of an NMOS type transistor 30 mounted as a diode. The cathode of the Zener diode 13 will be connected to the second terminal of this capacitor 29 by means of an NMOS type transistor 31 mounted as a diode. Thus, the Zener diode 13 will be supplied with a voltage that can reach 3*VCC. To limit the reverse current going through the Zener diode 13, care will be taken to choose a ratio of gate width to gate length such that the NMOS type transistor 31 is resistive (for example, by taking a ratio of 2/5, the dimensions being expressed in micrometers). If the last multiplication stage is not used, then it is on the PMOS type transistor 24 of the switch 32 that the value of the reverse current flowing through the Zener diode 13 will depend.

The differential stage 19 of the limiting circuit 2 has two inputs and two outputs.

The first input of the stage 19 is connected to the control gate of an NMOS type transistor 35 series-connected with a resistor 36 between the supply terminal 3 and the ground 4.

The second input of the stage 19 is connected to the control gate of an NMOS type transistor 37 series-connected with a resistor 38 between the supply terminal 3 and the ground 4.

The first output of this stage 19 is formed by the midpoint of the transistor 35 and the resistor 36.

The second output of this stage 19 is formed by the midpoint of the transistor 37 and the resistor 38.

R1 designates the value of the resistor 36, I1 designates the current flowing through the arm formed by this resistor 36 and the transistor 35, and V1 designates the voltage present at the first output.

R0 designates the resistor 38, I0 the current flowing through the arm formed by this resistor 38 and the transistor 37, and V0 the voltage present at the second output.

The differential stage receives value of VBS at its first input and VREF at its second input.

We have V1=VCC−R1* I1 and V0= VCC−R0 * I0. If identical transistors 35 and 37 are considered, the voltages V1 and V0 will be a function of the values of the resistors R1 and R0 and of the input voltages VBS and VREF. In a standard way, the comparator 15 has two arms, each constituted by two transistors, respectively a PMOS type and NMOS type transistor, mounted between the supply terminal 3 and the ground 4. The PMOS type transistors 39 and 40 of the first and second arms form a current source. Their control gates are connected and that of the transistor 40 of the second arm is connected to the drain of this same transistor 40.

The NMOS type transistor 41 of the first arm receives V0 at its control gate (-input of the comparator) and the NMOS type transistor 42 of the second arm receives V1 at its control gate (+input of the comparator).

Thus, if VBS<R1/R0* VREF then V1>V0 and if VBS>R1/R0* VREF then V1<V0

In the example considered, we have R1/R0 approximately 0.8.

Furthermore, the values of R1 and R0 shall be fixed in such a way that the voltages V0 and V1 are lower than VCC, so that the comparator works properly.

The output of the comparator 15 is formed by the midpoint of the transistors of the first arm of this comparator. The output signal of the comparator is called CONTROL. If V1>V0, then CONTROL is at logic 0 (ground potential).

If V1<V0, then CONTROL is at logic 1 (potential VCC).

The limiting means of the voltage regulation circuit 2 comprise:

NMOS type current limiting transistors 16 and 17 that are diode-mounted and series-connected, a first NMOS type voltage limiting transistor 43 series-connected with the transistors 16 and 17, a second NMOS type voltage limiting transistor 18 series-connected with the first transistor 18 and having its source connected to the ground 4.

The control gate of the first limiting transistor 43 is connected to the output 60 of the voltage multiplier circuit 14. The control gate of the second limiting transistor 18 is connected to the output of an inverter 50 whose input is connected to the output of the comparator 15. The control gate of the transistor 18 therefore receives the signal/ $\overline{\text{CONTROL}}$.

The transistors 16 and 17 can be used to limit the current flowing in the limiting means. This is a way of preventing an excessively rapid discharging of the equivalent capacitor 12 when it is connected to the ground by means of the limiting transistors.

The limiting transistor 17 can be used to limit the internal voltage VBS only to the extent that there is actually a reference voltage VREF equal to the reverse voltage of the Zener diode. This is not inconvenient inasmuch as the clock signal CK is common to the two voltage multiplier circuits 6 and 14. Were this transistor to be absent, it would be inconvenient since the output voltage VBS would be limited whenever the clock signal CK was in the low state, the currents then being no longer comparable in the arms of the differential stage 19. Furthermore, since it is sought to limit a voltage obtained by means of a voltage multiplier circuit, the absence of limiting causes no damage inasmuch as this absence occurs when no loads are transferred to the output of this circuit. Indeed, the voltage present at the terminals of the equivalent capacitor 12 will then be constant or decreasing, but can in no case be increased.

FIG. 3 shows a part of the regulator circuit 2 where it is desired to inhibit the voltage limitation.

The regulator circuit 2 will have an input 44 to receive a binary control signal CLAMP.

With respect to the comparator 15, a PMOS type transistor 45 will be added in parallel with the PMOS type transistor 39 of the first arm. Furthermore, the control gate of the NMOS type transistor 41 of this same arm will be connected to the drain of an NMOS type transistor 47 whose source is connected to the ground 4. The control gate of this transistor 47 will be connected to the output of an inverter 48, whose input will be connected to the input 44. This control gate will therefore receive the signal $\overline{\text{CLAMP}}$. Furthermore, an NMOS type transistor 46 receiving the signal CLAMP at its control gate could be series-connected between the sources of the NMOS type transistors 41 and 42 of the comparator and the ground 4.

With regard to the differential stage 19, the resistors 36 and 38 will be formed by P-type transistors 56 and 58 receiving the signal $\overline{\text{CLAMP}}$ at their control gates and an NMOS type transistor 49 will be parallel-connected with the transistor 58 38, the control gate of this transistor 49 receiving the signal $\overline{\text{CLAMP}}$ at its control gate.

Thus, when CLAMP=0, there will be V1=VCC, V0=0, CONTROL=1 and $\overline{\text{CONTROL}}$=0. If CLAMP=1, then there will be CONTROL=0 or 1 depending on the respective values of V0 and V1.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A voltage regulator circuit to limit an internal supply voltage produced by a supply circuit, the regulator circuit comprising:

a zener diode to produce a reference voltage;

means for limiting the internal supply voltage;

a dissymetrical differential stage having first and second inputs and first and second outputs, the first input being coupled, within the dissymetrical differential stage, to a control gate of a first transistor series-connected with a first resistor between a supply voltage and a ground reference voltage, the second input being connected, within the dissymetrical differential stage, to a control gate of a second transistor, series-connected with a second resistor between the supply voltage and the ground reference, the first output being formed by a midpoint of the first transistor and the first resistor, the second output being formed by the midpoint of the second transistor and the second resistor, and wherein the first and second outputs are coupled to first and second inputs of a comparator, and the first and second inputs are respectively coupled to the zener diode and the supply circuit; and the comparator providing a control voltage to control the limiting means.

2. The circuit according to claim 1, further comprising a voltage-multiplier circuit coupled to the zener diode.

3. The circuit according to claim 1, wherein the limiting means includes a first limiting transistor.

4. The circuit according to claim 3, wherein the limiting transistor has a control gate connected to an output of the comparator.

5. The circuit according to claim 3, wherein the limiting means further includes a second limiting transistor, disposed is series with the first limiting transistor, having a control gate connected to an output of the voltage multiplier circuit.

6. The circuit according to claim 5, wherein the limiting means reduces the internal supply voltage, such that it is less than a regulation voltage.

7. The circuit according to claim 1, wherein the limiting means reduces the internal supply voltage, such that it is less than a regulation voltage.

8. The voltage regulator circuit of claim 1, wherein the reference voltage is greater than the internal supply voltage.

9. The voltage regulator circuit of claim 8, wherein an operating voltage of the differential stage and the comparator are less than the internal supply voltage.

10. The circuit according to claim 1, further comprising control means to inhibit the voltage regulator circuit when a limitation control binary signal is in a first state.

11. The voltage regulator circuit of claim 1, disposed in an integrated circuit and coupled to a supply circuit which provides the internal supply voltage.

12. The circuit according to claim 11, wherein the supply circuit is a voltage multiplier circuit, receiving a supply voltage at an input, and providing the internal supply voltage which is higher than the supply voltage.

13. The circuit according to claim 11, wherein the integrated circuit is an electrically programmable memory.

14. A voltage regulator circuit for regulating a supply voltage comprising:

a reference voltage source that provides a reference voltage; and a differential stage having first and second inputs and first and second outputs, the first input being coupled to the supply voltage, the second input being coupled to the reference voltage source, the first output providing a first voltage proportional to the supply voltage, the second output providing a second voltage proportional to the reference voltage.

15. The voltage regulator circuit of claim 14, further comprising a comparator having first and second inputs and an output, the first input being coupled to the first output of the differential stage to receive the first voltage, the second input being coupled to the second output of the differential stage to receive the second voltage, the output providing a control signal, the control signal being at a first binary state when the first voltage is greater than the second voltage, the control signal being at a second binary state when the second voltage is greater than the first voltage.

16. The voltage regulator circuit of claim 15, further comprising a limiter having a first input coupled to the supply voltage and a second input coupled to the output of the comparator, the limiter reducing the supply voltage in response to the control signal.

17. The voltage regulator circuit of claim 16, wherein the reference voltage is greater than the supply voltage.

18. The voltage regulator circuit of claim 17, wherein an operating voltage of the differential stage and the comparator are less than the supply voltage.

19. The voltage regulator circuit of claim 14, wherein the reference voltage is greater than the supply voltage.

20. The voltage regulator circuit of claim 14, further comprising an inhibitor circuit that receives an inhibitor signal and inhibits the voltage regulator circuit in response to an inhibit command.

21. A voltage regulator circuit for regulating a supply voltage to a regulated voltage, the voltage regulator circuit comprising:

a reference voltage source that provides a reference voltage;

means, responsive to the supply voltage and the reference voltage, for comparing a signal proportional to the supply voltage with a signal proportional to the reference voltage and for providing a control signal when the signal proportional to the supply voltage is greater than the signal proportional to the reference voltage;

a limitation circuit that limits the supply voltage to the regulated voltage in response to the control signal; and wherein the reference voltage is greater than the regulated voltage.

22. A method of providing a regulated supply voltage, from an operating voltage that is less than the supply voltage, using a reference voltage that is greater than the supply voltage, the method comprising steps of:

generating a first voltage proportional to the supply voltage;

generating a second voltage proportional to the reference voltage;

comparing the first voltage with the second voltage to determine if the supply voltage is greater than a regulation voltage; and reducing the supply voltage when the supply voltage is greater than the regulated voltage.

\* \* \* \* \*

UNITED STATES PATENT AND TRADEMARK OFFICE
CERTIFICATE OF CORRECTION

PATENT NO. : 5,612,611

DATED : March 18, 1997

INVENTOR(S): Sylvie DROUOT and Gerard SILVESTRE DE FERRON

It is certified that error appears in the above-identified patent and that said Letters Patent is hereby corrected as shown below:

```
Title page,insert
```
at [75] Inventors: Sylvie Drouot, Luynes; Gerard Silvestre de Ferron, Fuveau, both of France Signed and Sealed this Thirteenth Day of May, 1997

*Attest:*

BRUCE LEHMAN

*Attesting Officer*     *Commissioner of Patents and Trademarks*